United States Patent [19]
Colwell et al.

[11] Patent Number: 5,698,873
[45] Date of Patent: Dec. 16, 1997

[54] HIGH DENSITY GATE ARRAY BASE CELL ARCHITECTURE

[75] Inventors: Michael J. Colwell, Livermore; Teh-Kuin Lee, San Jose, both of Calif.

[73] Assignee: LSI Logic Corporation, Milpitas, Calif.

[21] Appl. No.: 613,040

[22] Filed: Mar. 8, 1996

[51] Int. Cl.$^6$ ............................................. H01L 27/10
[52] U.S. Cl. ................................. 257/206; 257/204
[58] Field of Search ................................. 257/202–211

[56] References Cited

U.S. PATENT DOCUMENTS

| | | | |
|---|---|---|---|
| 3,968,478 | 7/1976 | Mensch, Jr. | 340/172.5 |
| 4,431,928 | 2/1984 | Skokan | 307/465 |
| 4,600,995 | 7/1986 | Kinoshita | 364/491 |
| 4,668,972 | 5/1987 | Sato et al. | 257/369 |
| 4,766,475 | 8/1988 | Kawashima | 257/204 |
| 4,816,887 | 3/1989 | Sato | 257/206 |
| 4,864,381 | 9/1989 | Seefeldt et al. | 357/45 |
| 4,893,168 | 1/1990 | Takahashi et al. | 257/204 |
| 4,910,680 | 3/1990 | Hiwatashi | 364/491 |
| 4,920,398 | 4/1990 | Yoshio et al. | 257/206 |
| 4,947,233 | 8/1990 | Aso | 357/68 |
| 4,975,758 | 12/1990 | Crafts | 357/45 |
| 4,978,633 | 12/1990 | Seefeldt et al. | 437/51 |
| 4,987,578 | 1/1991 | Akins et al. | 375/121 |
| 4,988,636 | 1/1991 | Masleid et al. | 437/51 |
| 4,992,845 | 2/1991 | Arakawa et al. | 357/42 |
| 5,019,889 | 5/1991 | Yoshio et al. | 257/206 |
| 5,045,913 | 9/1991 | Masleid et al. | 357/52 |
| 5,063,429 | 11/1991 | Crafts | 357/40 |
| 5,162,893 | 11/1992 | Okano | 257/203 |
| 5,291,043 | 3/1994 | Arakawa | 257/208 |
| 5,300,796 | 4/1994 | Shintani | 257/203 |
| 5,341,041 | 8/1994 | El Gamal | 257/204 |
| 5,347,150 | 9/1994 | Sakai et al. | 259/203 |
| 5,365,091 | 11/1994 | Yamagishi | 257/203 |
| 5,367,187 | 11/1994 | Yuen | 257/206 |
| 5,422,441 | 6/1995 | Iruka | 174/250 |
| 5,581,202 | 12/1996 | Yano et al. | 257/206 |

FOREIGN PATENT DOCUMENTS

| | | | |
|---|---|---|---|
| 63-314847 | 12/1988 | Japan | 257/206 |
| 6-089988 | 3/1994 | Japan | 257/206 |
| 6-089989 | 3/1994 | Japan | 257/206 |

OTHER PUBLICATIONS

Cheryl Ajluni, "Base Cell Design Spawns Advanced Arrays," Electronic Design, Sep. 19, 1994.

Japanese Application No. 62–193525, vol. 13, No. 230, (E–764), May 26, 1989.

*Primary Examiner*—Tom Thomas
*Assistant Examiner*—David B. Hardy
*Attorney, Agent, or Firm*—Hickman Beyer & Weaver

[57] ABSTRACT

A base cell design is disclosed, which base cell design includes ten transistor base cell design that includes (1) a first group of four n-type transistors; (2) a second group of four p-type transistors; and (3) a third group of two n-type transistors. The transistors in the first and second groups have substantially the same gate widths, while the transistors of the third group have a substantially smaller gate width. Further, the transistors of the first and second groups all have gates that are aligned in parallel with a first axis, and the transistors of the third group all have gates that are aligned in parallel with a second axis that is substantially perpendicular to the first axis. The first and second groups of transistors each contain at least one set of two transistors which are connected in series and share a source/drain region.

33 Claims, 8 Drawing Sheets

HIGH DENSITY GATE ARRAY BASE CELL ARCHITECTURE

CROSS REFERENCE TO RELATED APPLICATIONS

This application is related to pending U.S. patent application Ser. No. 08/613,038 (attorney docket no. LSI1P043 LLC-2189/1D/1P) filed on the same day as the instant application, and naming Michael J. Colwell, Teh-Kuin Lee, Jane C. T. Chiu, Abraham Yee, Stanley Yeh, and Gobi Padmanabhan as inventors, and entitled "PROGRAMMABLE POLYSILICON GATE ARRAY BASE CELL ARCHITECTURE". That application is incorporated herein by reference for all purposes.

BACKGROUND OF THE INVENTION

The present invention relates generally to complementary metal oxide semiconductor ("CMOS") gate array structures. More particularly, the invention relates to a base cell design for such gate arrays, which design increases the actual gate density of gate arrays and improves the performance of circuits constructed thereon.

A gate array is a type of integrated circuit ("IC") made from an array of repeating identical base cells in a core region of a semiconductor chip. Each such base cell contains the same predetermined number and arrangement of MOS transistors. And, as in all MOS-based ICs, each such transistor includes two source/drain regions separated by a channel region in a silicon substrate, together with a gate located over the channel region. Each gate includes a thin layer of gate oxide sandwiched between a polysilicon gate electrode and the channel region of the substrate.

A gate array masterslice structure contains no prespecified circuitry, only unconnected MOS transistors which will later be wired to one another to form circuit elements. Thus, a transistor level gate array structure provides the flexibility to form many different types of integrated circuits—such as for example memory chips and logic chips. The ultimate design of such gate array integrated circuits is determined by the back-end processing employed (i.e., the processing to form and pattern metallization layers and thereby create wiring between the many transistors available on the underlying base cells). It is the arrangement of these interconnections that defines the circuitry present on a given gate array integrated circuit. Because of their versatility, gate arrays are widely used to make application specific integrated circuits (ASICs).

Figure 1A:
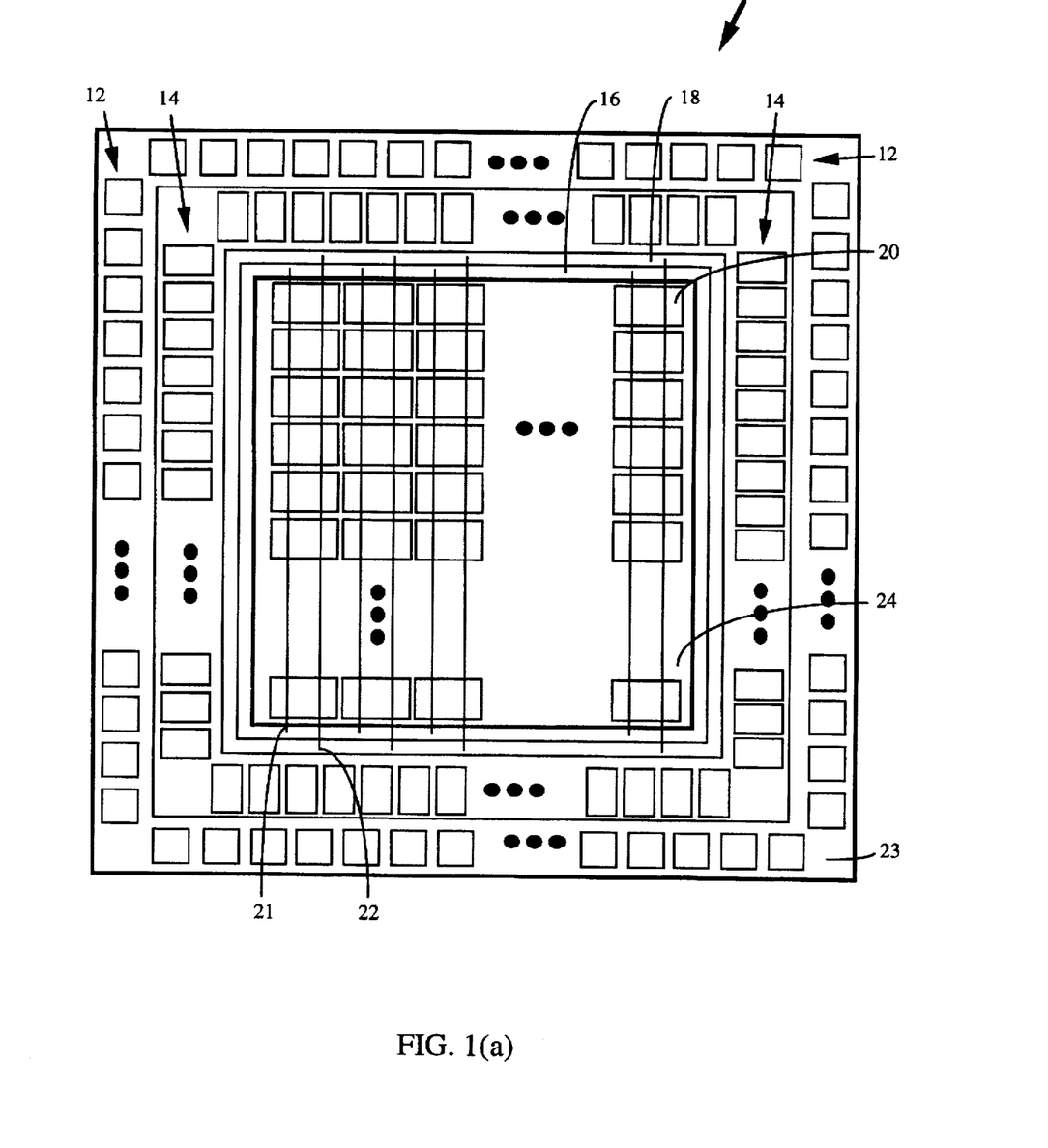
FIG. 1a is a top view of a semiconductor die having a plurality of base cells in a gate array format.

FIG. 1a shows a basic gate array structure 10 provided on a semiconductor die 23 and including a core region 24 containing an array of identical base cells such as base cell 20. As shown, the base cells are generally rectangular and are arranged in repeating rows and columns. Within each base cell, a collection of transistors (not shown) is provided. In each column of base cells within the core region 24, a first metal line 21 and another first metal line 22 span the length of the core region. Metal line 22 is used to deliver power (Vdd) to individual base cells in the column of the array, while metal line 21 provides ground (Vss) to each base cell in the column. Gate array 10 also includes Vdd metal line 18 and Vss metal line 16 ringing the core perimeter to provide power and ground to the metal lines 22 and 21.

The gate array structure 10 also includes input/output ("I/O") pads 12 and I/O slots 14 located around the perimeter of the die 23 and outside of the core region 24. These pads form the contact region for wire bonds or other electrical connections that connect the IC circuitry to external elements. The I/O slots 14 contain transistors and other devices used for interfacing with the external elements to which die 23 is connected. Typically slots 14 will provide such functions as Electrostatic Discharge (ESD) protection, predrivers, and input and output buffers, etc.

Gate array designs such as the one shown in FIG. 1a should be contrasted with "cell based" designs. Cell based designs generally employ, in the chip's core region, many different base cells, as opposed to a single repeating base cell. Typically, the various base cells have different sizes, shapes, transistor arrangements, etc., and their layout is optimized for a given integrated circuit design. Because the base cell choice and arrangement is dictated by the integrated circuit design, cell based integrated circuits generally use available chip space more efficiently than gate array integrated circuits. However, cell based technology is often unsuitable for use with ASICs which are manufactured in insufficient volume to recoup the additional development costs generally associated with the cell based design process. Thus, gate array designs will continue to find widespread use in ASIC designs.

A major challenge of gate array technology is to efficiently use the transistors available in the base cell layout. This task is left primarily to computer programs which specify the circuit layout on the various base cells of the gate array. Unfortunately, such programs are often written for general purpose gate arrays and therefore do not make optimal use of available base cells. Typically, a circuit layout suggested by the computer program must be analyzed by design engineers, and, if feasible, the layout is manually improved to a limited extent. However, even with this combination of computer and human design, many transistors in the gate array go unused. "Raw gate density" is a measure used in the art to describe the maximum number of gates that can be hypothetically placed on a unit of gate array substrate area (assuming that all transistors in the gate array are used). In current 0.5 μm technology, raw gate density is typically on the order of about 8,000 gates per square millimeter. In most gate arrays, however, the actual gate density is only about 40 to 60% of the raw gate density.

Not surprisingly, efficient utilization of transistors in a gate array depends in large part on the base cell design. If a given base cell contains the same number and types of transistors as required in frequently used circuits of an ASIC, space is efficiently utilized in a gate array integrated circuit. In the past, it has been common to employ base cells having many transistors so that relatively large circuits such as multiplexers, many input flip-flops, latches, and dedicated memory blocks could fit in a single base cell. For example, a base cell having 20 transistors—12 p-type, 4 large, high-drive n-type, and 4 small, low-drive n-type transistors—is described in Ajluni "Base Cell Design Spawns Advanced Arrays" Electronics Design, pp. 178–79 (1994). Unfortunately, such large base cells often must be carved into various smaller domains when smaller circuits such as random access memory circuits make up much of the ASIC design. This has the problematic consequence of reducing the actual gate density of a design.

Figure 1B:
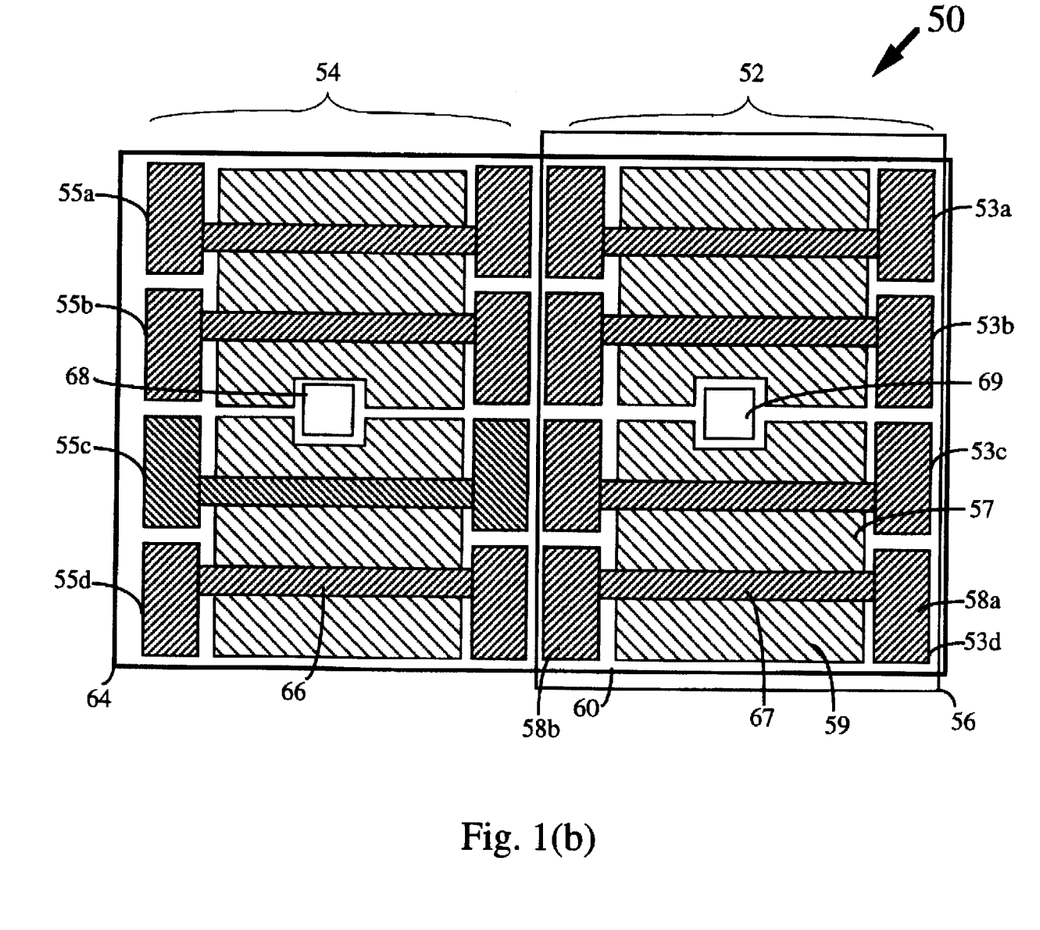
FIG. 1b is a top view of a prior art base cell layout having eight uniform width and length transistors.

To address this issue, LSI Logic Corporation of Milpitas, Calif. (assignee of the present invention) has developed gate arrays employing a smaller base cell, which employs only 8 MOS transistors: 4 n-type and 4 p-type, all of approximately the same size. This design is illustrated in FIG. 1b which shows a base cell 50 having a p-type substrate 64, an n-type transistor side 54, and a p-type transistor side 52. The p-type transistor side 52 includes an n-well 56, in which four p-type transistors 53a–53d, all aligned in parallel with a single axis, are formed. As shown, each p-type transistor is identically sized and shaped.

Focusing on the p-type transistor 53d, a polysilicon gate electrode 67 is provided between a source diffusion region 59 and a drain diffusion region 57. Also, the gate electrode 67 terminates in two polysilicon contacts ("poly-heads") 58a and 58b. A tap 69 is provided between transistors 53b and 53c to provide contact to a Vdd power line. The n-type transistor side 54 includes four n-type transistors 55a–55d, all aligned parallel with the transistors of p-type transistor side 52. As shown in n-type transistor 55d, for example, a gate electrode 66 of similar size and shape to gate 67 is provided. Further, a tap 68 is provided between n-type transistors 55b and 55c to provide contact to a Vss ground line.

The base cell shown in FIG. 1b represents a significant advance in the gate array art. Many types of relatively small circuits can fit efficiently within such base cell and utilize all transistors. For example, two 4-transistor NAND gates fit within a single base cell and utilize all available transistors. While this base cell provides an optimal transistor layout for many simple gates, certain random access memory ("RAM") circuits do not fit completely within the base cell. This can present a problem in those ASIC designs that devote a significant percentage of the available chip area to memory. Thus, it would be desirable to provide a gate array with a base cell optimized for memory circuits.

SUMMARY OF THE INVENTION

The present invention fills this need with a ten transistor base cell design that very efficiently fits a two-port RAM cell. As a result, the actual gate density of a gate array structure is improved in memory intensive integrated circuits. The base cell design of this invention also makes efficient use of transistors and other chip resources in certain logic-intensive integrated circuits. Specifically, the base cell designs of this invention can be used to facilitate efficient arrangement of flip-flops, latches, multiplexers, etc.

In one aspect, the present invention provides a gate array structure formed on a semiconductor substrate and having an array of identical base cells in a core region of the structure. Each such base cell may be characterized as including the following elements: (1) a first group of transistors of a first conductivity type, each having a first gate width; (2) a second group of transistors of a second conductivity type, opposite the first conductivity type, each transistor of the second group having a second gate width that is substantially equal to the first gate width; and (3) a third group of transistors of the first conductivity type, each having a third gate width which is smaller than the first and second gate widths. Preferably, the transistors of the first and second groups all have gates that are aligned in parallel with a first axis, and the transistors of the third group all have gates that are aligned in parallel with a second axis that is substantially perpendicular to the first axis. In a specific preferred embodiment, the first group of transistors has four transistors, the second group of transistors has four transistors, and the third group of transistors has two transistors, with first and third groups including n-type transistors and the second group including p-type transistors. Further, the first and second groups of transistors preferably each contain at least one set of two transistors which are connected in series and share a source/drain region.

In a completed integrated circuit, the gate array structure is wired with conductive lines which provide power (Vdd) and ground (Vss) to at least the transistors of the first and second groups of transistors. Further, the transistors within the base cells are wired to efficiently form various circuits such as a two-port (1r 1w) RAM circuit. Preferably such RAM circuits are laid out such that they use every transistor in a base cell and one of the transistors of the third group is directly connected to a first input of the circuit and a second of the transistors of the third group is directly connected to a second input of the circuit. By using the smaller transistors of the third group for the inputs, such circuits draw less current and have reduced capacitances, thereby improving circuit performance. In addition, the transistors within multiple base cells may be wired to form more complex circuits such as flip flops in which one or more transistors from the third group of transistors is directly connected to a clock input. Preferably, the base cell layout allows most or all circuit level wiring to be provided at a first metallization layer. If necessary, however, second or higher metallization layers may also be employed.

In another aspect, the present invention provides a method of fabricating a gate array having the structure described above by forming an array of identical base cells in a core region of the structure. Each such base cell is prepared by forming first, second, and third transistor groups in the base cell. To wire the gate array and thereby form circuits, at least the following steps are performed: (1) forming a first metallization layer over at least a portion of the core region; and (2) patterning the first metallization layer to provide electrical connections between at least some of the transistors in the base cells. In some embodiments consistent with conventional fabrication technology, it may also be necessary to perform the following steps: (1) forming a second metallization layer over at least a portion of the core region; and (2) patterning the second metallization layer to provide further electrical connections between at least some of the transistors. In the end, the methods of this invention produce an integrated circuit such as an ASIC.

The features and advantages of this invention will be further described below in the detailed description with reference to the associated figures.

DETAILED DESCRIPTION OF THE PREFERRED EMBODIMENTS

1. Base Cell Layout

Figure 2:
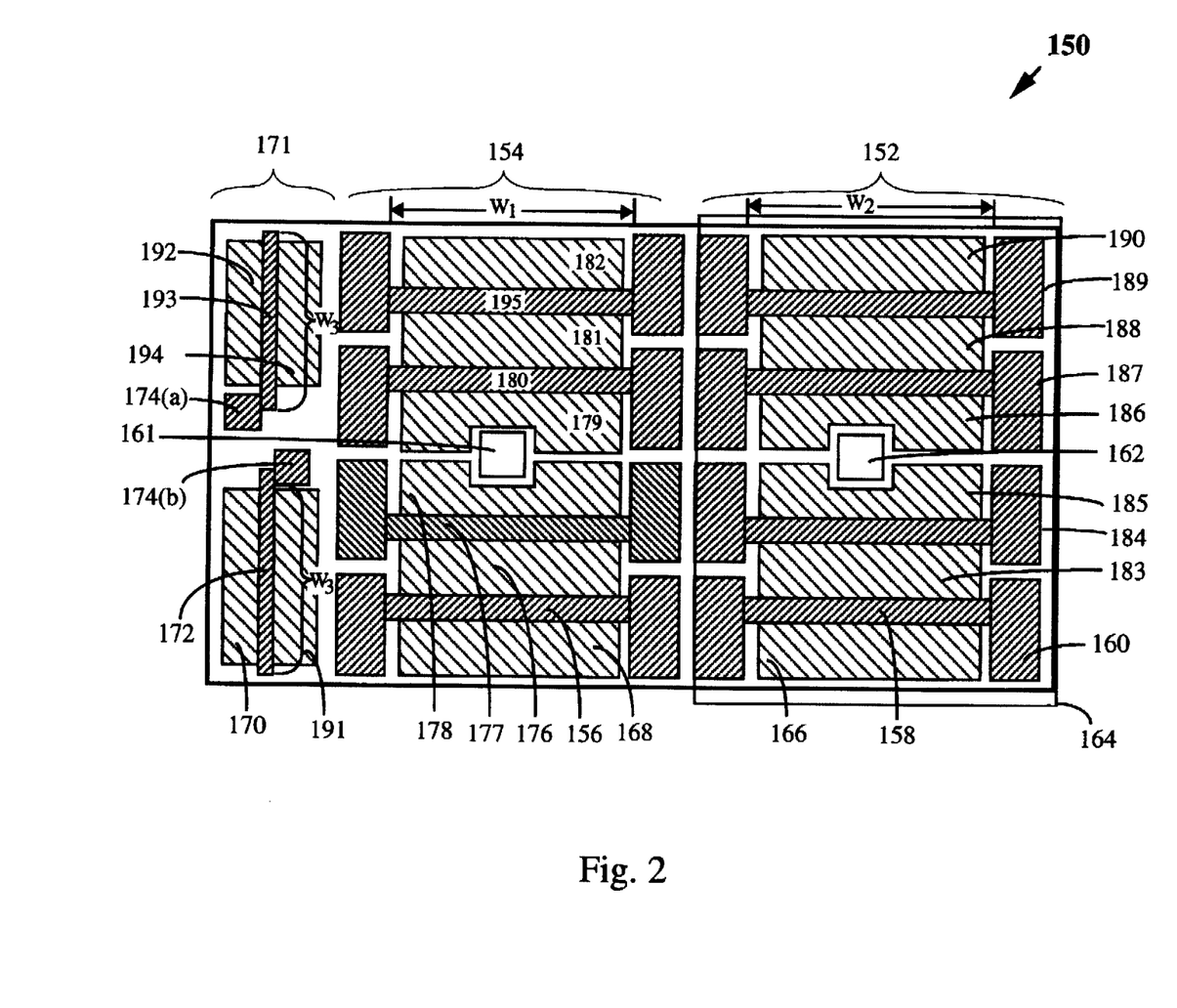
FIG. 2 is a top view of the base cell design of the present invention, having ten transistors of various widths.
Figure 3A:
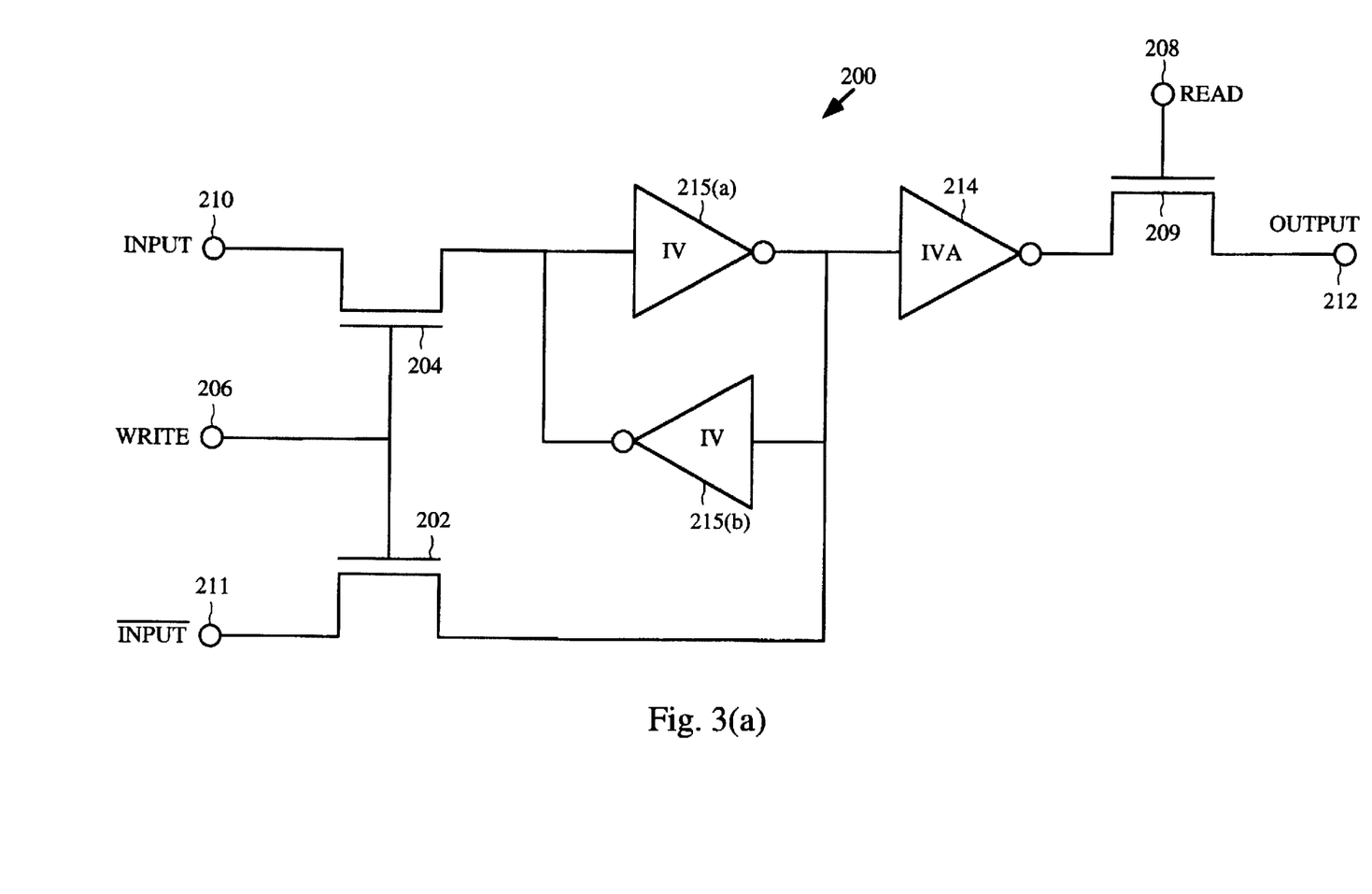
FIG. 3a is a transistor level circuit layout of a two-port (1r 1w) RAM circuit.

The preferred embodiment of the present invention will now be described with reference to FIGS. 2 through 4. FIG.

2 shows a base cell 150 formed on a p-type semiconductor substrate and having a first group of transistors 154 which are n-type, and a second group of transistors 152 which are p-type, and a third group of transistors 171 which are n-type. The second transistor group 152 includes four PMOS transistors formed in an n-type well 164. The first transistor group 154 includes four NMOS transistors, and the third transistor group 171 includes two more NMOS transistors. The transistors of the third group differ from the transistors of the first and second groups primarily in their size and orientation within the base cell 150. As shown, the transistors of third group 171 have a substantially shorter gate width than the transistors of first and second groups 154 and 152. As explained in more detail below, this base cell layout is particularly useful in those circuit designs that can employ one or more small transistors.

Focusing now on the first group of transistors 154, a first MOS transistor includes an n-type source/drain diffusion region 168, an n-type source/drain diffusion region 176, and a gate 156. The gate 156 includes a polysilicon gate electrode and an underlying gate dielectric (not shown). A second transistor in the first group is connected in series with the first transistor through source/drain region 176, which also acts as a source/drain for the second transistor. In addition, the second transistor includes an n-type source/drain diffusion region 178 and a gate 177. Further, the first group of transistors 154 includes a second set of transistors connected in series. Specifically, a third transistor includes an n-type source/drain diffusion region 179, an n-type source/drain diffusion region 181, and a gate 180. The source/drain region 181 also serves as a drain for a fourth transistor of the first group. In addition, that transistor includes an n-type source/drain diffusion region 182 and a gate 195.

Finally, within the first group of transistors 154, a tap contact 161 resides between the two sets of two transistors and includes a region of high concentration p-type dopant in the p-type silicon substrate to act as an ohmic contact for a ground (Vss) line (not shown). As discussed above with reference to FIG. 1a, a Vss line formed from a first metallization layer provides ground contacts to many base cells in a column of the gate array. It is this Vss line that provides contact to ground by interconnecting with tap 161. A corresponding tap 162 is provided in the second group of transistors 152 to contact with a power (Vdd) line (not shown). Like tap 161, tap 162 includes a region of increased dopant concentration (n-type in this case) in the n-well to provide an ohmic contact with the Vdd line.

The transistors of the second group 152 mirror the transistors in the first group 154, but are of the opposite type (i.e., the second group transistors are PMOS transistors). Specifically, a first transistor within second group 152 includes a p-type source/drain diffusion region 166, a p-type source/drain diffusion region 183, and a gate 158. A second transistor of the second group 152 includes diffusion region 183 as a source/drain region, a gate 184, and a p-type source/drain diffusion region 185. Thus, the first and second transistors of group 152 are connected in series through diffusion region 183. A second set of transistors in the group 152 includes a third transistor having p-type source/drain diffusion region 186, a gate 187, and a p-type source/drain diffusion region 188. The diffusion region 188, in turn, acts as source/drain region for a fourth transistor, such that the third and fourth transistors in the second group 152 are connected in series. The fourth transistor of the second group also includes a gate 189 and a source/drain diffusion region 190.

Finally, the third group of transistors 171 includes a first NMOS transistor having source/drain diffusion regions 170 and 191 separated by a gate 172. Group 171 also includes a second NMOS transistor having source/drain regions 192 and 194 separated a gate 193. The gates of the two NMOS transistors of the third group 171 incorporate polysilicon-heads 174a and 174b at the facing ends of their polysilicon gate electrodes. These structures are provided to facilitate forming interconnects to the gates, and therefore are made somewhat longer than the rest of the gate electrode structure. Note that the transistors of the first and second groups 154 and 152 also include polysilicon-head regions to facilitate contact with overlying metal lines. In fact, each such transistor includes a polysilicon-head at both ends of the gates (see e.g., regions 160a and 160b on gate 158).

There are various distinctions between the transistors of the third group 171 and the remaining transistors of the first and second groups. For example, unlike the transistors of the first and second groups, the two transistors of the third group 171 are not connected in series. Further, the transistors of the third group are oriented substantially perpendicular to the transistors of the first and second groups. That is, the transistors of the first and second groups all have gates that are aligned in parallel with a first axis, and the transistors of the third group all have gates that are aligned in parallel with a second axis that is substantially perpendicular to the first axis. This conserves space in the base cell. If the transistors of the third group 171 are not used in an integrated circuit, the space over these transistors serves as a convenient routing path for conductive lines on the first metallization layer. Thus, for some designs, all or most circuit level routing can be completed on the first metal layer (metal-1). This increases available second level metal (metal-2) routing possibilities by reducing the need for metal jumpers on metal-2.

The relatively small size of the transistors of the third group also has certain advantages. To the extent that a circuit can utilize such transistors, the circuit will have a lower capacitance because the gate capacitance of the smaller transistors is less than the gate capacitance of the larger transistors in the first and second groups. Further, the smaller transistors draw less current and therefore may require smaller current carrying lines, thereby further conserving space on the resulting integrated circuit, and increasing the usable gate density significantly.

In a specific preferred embodiment, gate electrodes of transistors in the first group 154 (e.g., gate electrode 156) have a gate width ($W_1$) of about 5.7 µm, while gate electrodes of transistors in the second group 152 (e.g., gate electrode 158) have a gate width ($W_2$) of 5.9 µm. The shorter gate electrodes of transistors in the third group 171 (e.g., gate electrode 193) have a gate width ($W_3$) of only about 3.65 µm. In this embodiment, the gate widths do not include the width of the polysilicon heads (e.g., poly heads 160a and 160b). The gate length of both p-type and n-type transistors is 0.40 µm. As is well known to those skilled in the art, metal line interconnections of a gate array are arranged with reference to a grid spacing on the base cells. The grid spacing of this specific embodiment is about 1.4 µm by 1.4 µm, and a single base cell includes 15 grid points (21 µm) in the X direction and 8 grid points (11.20 µm) in the Y direction. The base cell area is therefore 235.20 microns square.

In a further specific preferred embodiment, the base cell 150 has four (metal-1) on-grid routing tracks (not shown) to the left of Vss line and two on-grid routing tracks (not shown) to the right of Vdd line. As discussed in more detail below, a Vss metal line runs over tap 161 and parallel to the muting tracks. In addition, a Vdd metal line runs over tap 162 and parallel to the routing tracks. To the extent that on-grid routing tracks are available, chip-level routing lines can be formed thereon. In the specific embodiment described herein, the routing line widths are preferably about 0.50 μm, but somewhat wider lines may be employed if required to satisfy the appropriate CMOS design rules.

2. Circuit Layout on Base Cells

The ten transistors of the base cells of this invention are particularly well suited for use with certain RAM circuits. For example, RAM circuits such as the one schematically depicted in FIG. 3a (and further illustrated in FIGS. 3b and 3c) employ four PMOS transistors and six NMOS transistors, two of which may be smaller than the others. FIG. 3a shows a preferred two port (1r 1w) RAM circuit 200 for use with this invention. The two port RAM circuit 200 includes an output 212, and inputs 210 and 211 provided to NMOS transistors 204 and 202 respectively. A write terminal 206 is provided to the gates of both NMOS transistors 204 and 202, and a read terminal 208 is provided to the gate of transistor 209. Furthermore, a pair of inverters 215a and 215b are connected in parallel between NMOS transistor 204 and an inverter 214. Inverter 214 is, in turn, connected to transistor 209. The inverters 215a and 215b are standard CMOS inverters employing one NMOS transistor and one PMOS transistor. The inverter 214, however, is a three transistor inverter employing a single NMOS transistor and two PMOS transistors connected in parallel.

Figure 3B:
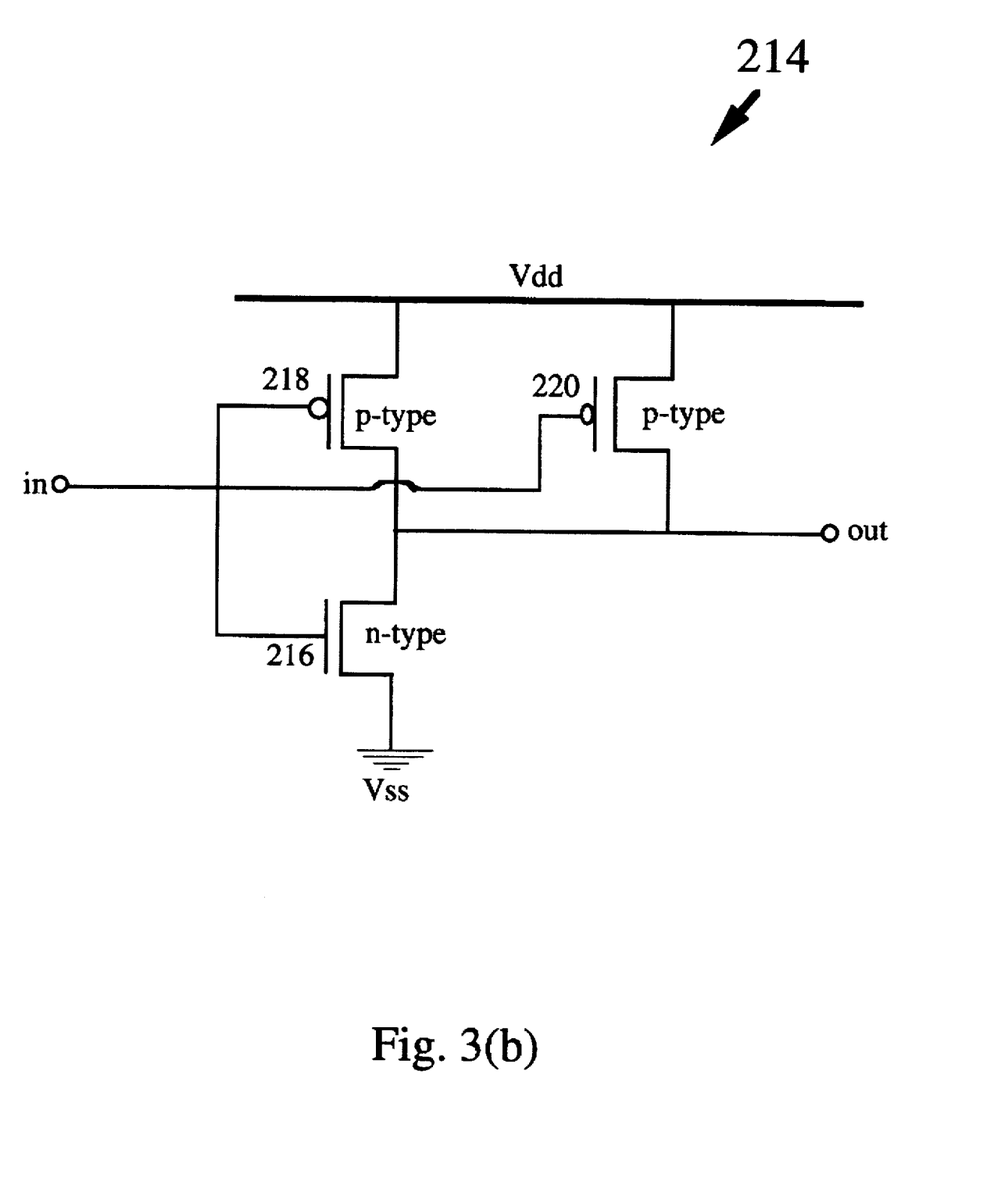
FIG. 3b is a transistor level circuit layout of an inverter having one n-type transistor and two p-type transistors in parallel.

A transistor level representation of inverter 214 is schematically shown in FIG. 3b. Inverter 214 includes an NMOS transistor 216 and PMOS transistors 218 and 220 connected in parallel. As can be seen, inverter 214 takes the form of a standard two transistor CMOS inverter, with the exception that the single PMOS transistor of a standard transistor is replaced with two PMOS transistors in parallel. This allows inverter 214 to switch faster because a single PMOS transistor generally has a slower rise time than a comparable NMOS transistor (of gate width equal to the PMOS transistor). The use of two parallel PMOS transistors overcomes this imbalance.

As implied above, the base cell of the preferred embodiment allows a designer to construct the two port (1r 1w) RAM circuit of FIG. 3a on a single base cell without having to utilize neighboring base cells to complete the transistor network. Additionally, input transistors 204 and 202 of the RAM circuit are implemented as the two shorter gate width NMOS transistors (group 171) of FIG. 2. Thus, when implemented on the base cells of this invention, the size of RAM cell will be smaller and the RAM circuit 200 will have a relatively low input capacitance in comparison the same circuit implemented on a base cell having all the same size transistors. Thus, performance is improved and circuit speed is increased and gate density is increased. Furthermore, as is well known in the art, a lower input capacitance also reduces power consumption.

Figure 3C:
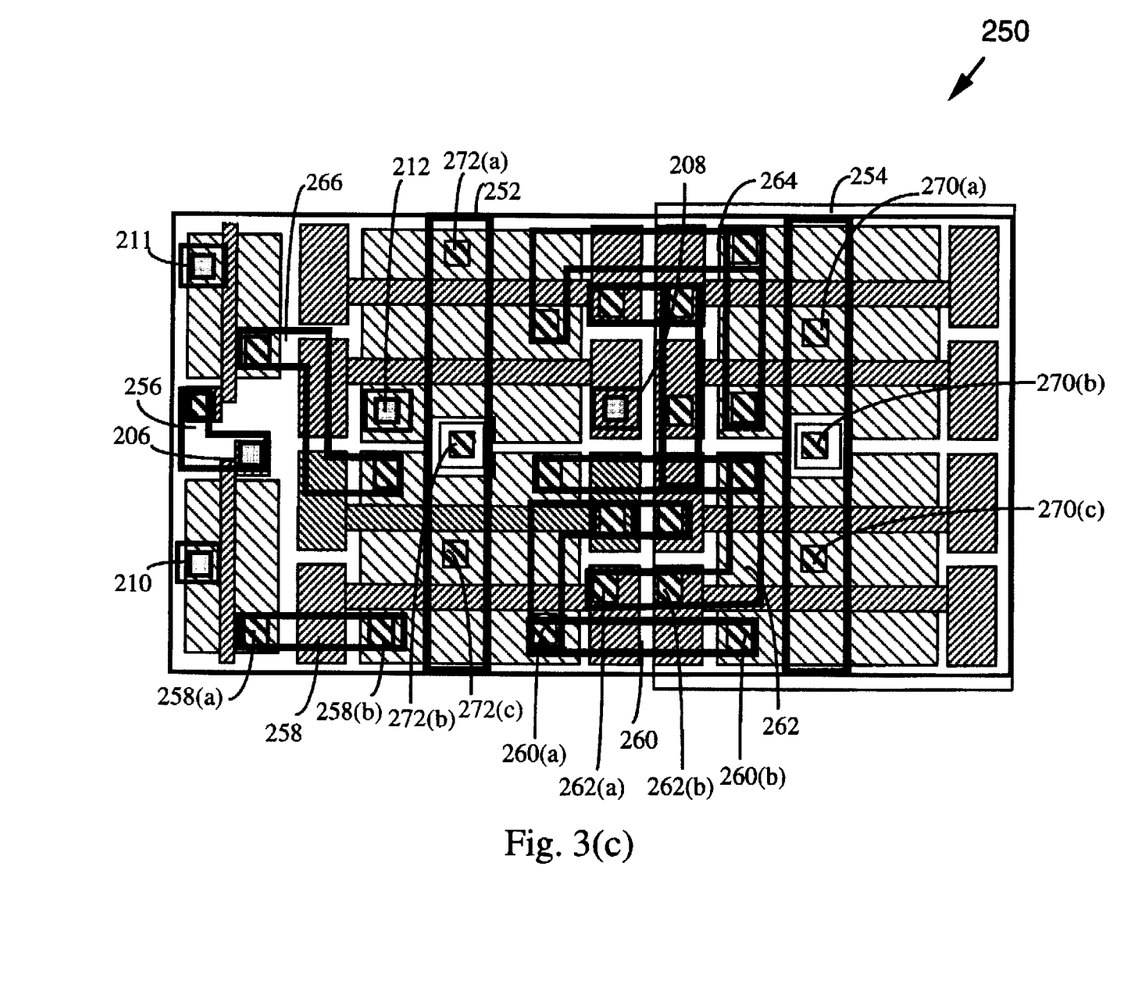
FIG. 3c is a top view of a base cell of the present invention having a two-port (1r 1w) RAM circuit constructed thereon.

FIG. 3c shows a base cell 250 of the present invention wired to form a two port-RAM circuit (as shown in FIG. 3a) using interconnections from a first metallization layer (metal-1) only. As should be understood, the metal-1 network provides the means by which a system designer makes transistor level interconnections. The RAM circuit of FIG. 3c includes the same transistor level base cell layout as shown in FIG. 2 and should be considered with reference to that figure. It also includes the same circuit layout as shown in FIGS. 3a and 3b and should therefore also be considered with reference to these figures as well.

Power and ground are supplied to the RAM circuit 200 by metal-1 lines 254 and 252, respectively. Specifically, in first group of transistors 154, ground line (Vss) 252 makes contact 272b with tap 161 and also makes contacts 272a and 272c with two source/drain diffusion regions. Further, in the second group of transistors 152, power line (Vdd) 254 makes contact 270b with tap 162 and also makes contact 270a and 270c with two source/drain diffusion regions. It should be understood that power and ground lines 254 and 252 form segments of lines that typically span entire columns of base cells in the gate array as illustrated by lines 22 and 21 in FIG. 1a. In a specific preferred embodiment, power lines Vdd and ground lines Vss are about 1.4 μm in width, with Vdd metal lines connected to a 3.3 volts power source.

RAM circuit inputs 210 and 211 are provided to the source/drain diffusion regions of the two NMOS transistors from third transistor group 171 (FIG. 2). Write terminal 206 connects to the polysilicon gates 172 and 193 also of the transistors from third group 171. Note that the write terminal 206 is directly connected to the poly-head 174b, and from there a metal-1 connection 256 is formed to poly-head 174a. Output 212 is connected directly to the drain 179 of the third transistor in the first group of transistors 154. And read terminal 208 is connected directly to the gate 180 of that same transistor. As will be understood by those of skill in the art, each terminal contact shown in FIG. 3c—such as inputs 210 and 211 and write terminal 206—represents a vertical interconnect and an associated via between a metallization layer and the underlying semiconductor substrate or polysilicon gate electrode. The outer rectangle shown at these terminals represents the perimeter of the via at the metal layer, while the inner rectangle represents the perimeter of the via at the substrate/gate level.

The transistors of base cell 250 not used in the input or output functions are employed in standard inverters 215a and 215b and special inverter 214 (see FIGS. 3a and 3b). As shown with reference to FIGS. 2 and 3c, inverter 215b consists of the first transistors of the first and second groups of transistors 154 and 152 in the base cell. The output of inverter 215b is connected by a contact 258a to a source/drain diffusion region of input transistor 204 (i.e., the first transistor in the third group transistors 171) through a metal-1 line 258 and a contact 258b. The output of inverter 215b is also provided to a metal-1 line 260 which is connected to diffusion region 168 from the first group of transistors by a contact 260a and to diffusion region 166 from the second group of transistors by a contact 260b. The input to inverter 215b is provided to a metal-1 line 262 which is electrically connected to gate 156 by a contact 262a and to gate 158 by a contact 262b.

As shown with reference to FIGS. 2 and 3c, inverter 215a consists of the second transistors from the first and second groups of transistors 154 and 152 in the base cell. The output of inverter 215b (through metal-1 line 260) provides the input to inverter 215a through contacts to gates 177 and 184 as shown in FIG. 3c. The output from inverter 215a is provided to metal-1 line 262, which also provides the input to inverter 215b. Note that metal-1 line 262 is connected to diffusion regions 178 and 185 of the transistors in inverter 215a.

The inverter 214 consists of the third and fourth PMOS transistors from the second transistor group 152 and the fourth NMOS transistor from the first transistor group 154. Metal-1 line 262—which provides the input to inverter 215b and the output from inverter 215a—also provides the input to inverter 214 through contacts to gates 187, 189, and 195 as shown. The output of inverter 214 is provided from metal-1 line 264 which contacts diffusion regions 186, 190, and 181 as shown. Line 264 is also connected to the third NMOS transistor in the first group 154 through the shared diffusion region 181. As indicated above, this transistor includes read terminal 208 and output terminal 212.

Figure 4A:
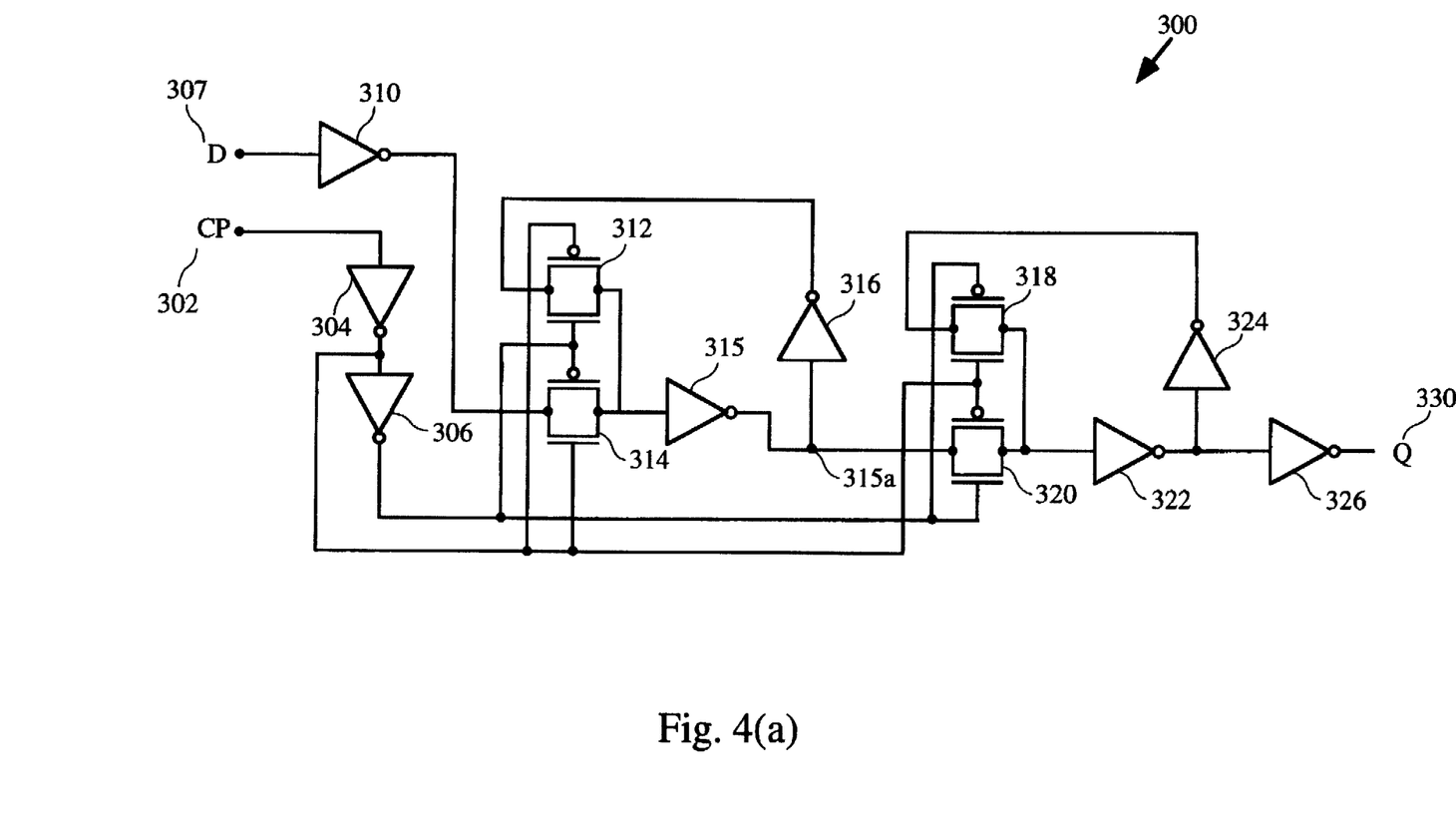
FIG. 4a is a transistor level circuit layout of a typical flip flop.
Figure 4B:
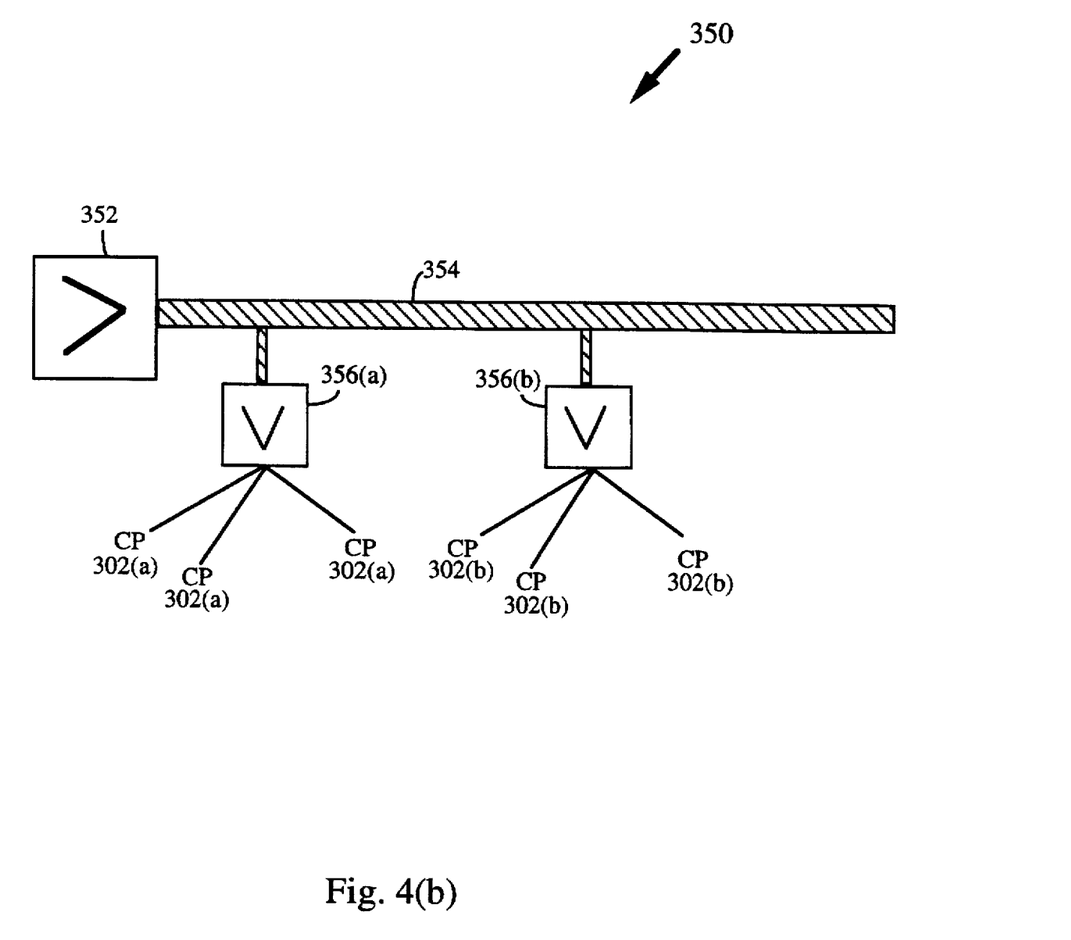
FIG. 4b is a circuit layout of a clock buffer system constructed on a base cell gate array of the present invention.

Referring now to FIG. 4a, a schematic diagram of a typical D-flip-flop circuit 300 having eight inverters and four transmission gates can be constructed on a gate array of the present invention. Because such circuits are frequently used in many ASIC designs (e.g., up to 50% of the core region may be dedicated to flip flop circuits), it would be advantageous to provide an efficient flip flop layout. As shown, one such flip flop circuit, a D-flip-flop circuit 300, includes two input CLK (clock) inverters 304 and 306 connected to a CLK by means of CP node 302. Data input pin (D) 307 is connected to inverter 310 which is connected to transmission gate 314. A second transmission gate 312 is connected to a feedback inverter 316, which in turn is connected between transmission gate 314 and inverter 315. A second pair of transmission gates 318 and 320 complete part of the D-flip flop where transmission gate 320 receives a signal from a circuit node 315a. Transmission gates 318, and 320 transmit a signal to inverter 322, which in turn provides a signal to feedback inverter 324 and output inverter 326 that leads to D-flip flop output pin (Q) 330.

In operation, as is known to those of skill in the art, a D-flip flop is designed to change states after a clock pulse leading edge is generated at CP node 302. For example, if a high signal "1" is received from the data input pin (D) 307 when the clock pulse is at its leading edge, the output pin (Q) 330 will register a high signal "1" as well. As is also well known in the art, D-flip flop circuit 300 is denoted a delay flip flop. This is so because once the output pin (Q) 330 registers a "1", that value will remain at the output pin (Q) 330, and any change in output pin (Q) 330 will be delayed until a low "0" is received at the data input pin (D) 307, and a new leading edge clock pulse coincide.

Typically, a D-flip flop 300 would preferably be constructed on three base cells of the present invention. To take advantage of the base cell layout of this invention, D-flip flop circuit 300 preferably is designed such that CLK inverters 304 and 306 are formed on the shorter n-type transistors provided in the third group of transistors 171 (FIG. 2). As discussed above, the shorter gate widths of these n-type transistors provide a lower input capacitance, thereby increasing circuit speed and reducing power consumption.

These benefits may have far reaching, system-wide, consequences. For example, an ASIC's entire clock buffer system may be more efficiently designed when employing the gate array structure of the present invention. FIG. 4b shows a clock buffer system 350 that is used to drive flip-flop circuits (such as those referred to in FIG. 4a) laid out on a gate array of this invention. A main clock buffer 352 provides clock signals to a clock trunk 354 formed from a conductive line at the metal-1 level. The clock trunk 354, in turn, provides clock signals to a plurality of branch buffers such as buffers 356a and 356b. In a preferred embodiment, each branch buffer will drive a pre-designated number of flip-flop circuits via CP nodes such as nodes 302a associated with buffer 356a and nodes 302b associated with buffer 356b.

Because the individual flip flop circuits employ clock inverters with relatively smaller transistors—which draw relatively low current—the line widths of the conductive lines 354 coupled to the clock buffers 352 and 356a and b may be relatively small, and the size of clock buffers may be reduced. This of course has the benefit of making more space available for routing at the metal-1 level. Also, the usable gate density will be higher, and power consumption will be decreased significantly.

3. Method of Fabricating Gate Arrays

Like most IC fabrication processes, the process of fabricating gate arrays of invention generally can be divided into "front end" steps and "back end" steps. Front end steps generally include those steps necessary to form the actual transistor elements such as source/drain regions, gates, and isolation regions. Back end steps generally include those process steps necessary to create circuitry by wiring the various transistors formed by the front end processing. As applied to gate arrays, front end processing produces the array of repeating base cells having the transistor layout described above, while back end processing produces the wiring to form circuits from the base cell transistors.

In front end processing, device active regions initially are formed and electrically isolated on a single crystal semiconductor substrate. Sometime thereafter, a gate oxide layer is formed on the substrate, and then a polysilicon layer is formed on the gate oxide layer (typically by CVD deposition). The resulting polysilicon layer is doped by ion implantation, masked, and etched to form gate electrodes. A resulting gate electrode layout is characterized by an array of repeating base cells, each having a base cell layout following the design set forth in FIG. 2, for example. After the gates have been formed, source/drain regions are formed by two or more ion implantation steps. At least one of these steps will form n-type source/drain regions of NMOS devices and the other implant will form p-type source/drain regions of PMOS devices. Typically, the NMOS transistor regions will be masked during the p-type implant and the PMOS transistor regions will be masked during the n-type implant. In this manner, the p- and n-type transistor groups are formed separately in the base cells. After the source/drain regions have been formed, a silicide is formed on top of the polysilicon and substrate to create less resistive "ohmic" contact regions. Finally a passivation layer of, e.g., borophosphosilicate glass ("BPSG") is deposited over the entire gate array structure. At this point, at the completion of the front end processing, the gate array structure has the potential to take on many different ASIC designs, as no circuits have yet been wired on the substrate.

The back end process steps of relevance to this invention will now be described. Initially, a contact mask is formed on the passivation layer to define contact regions to device elements on the substrate and to the associated polysilicon gate electrodes. Thereafter, the passivation region is etched (typically by a plasma etch) to form vertical contact holes through the passivation layer to level 1 (the underlying substrate and polysilicon). At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various device elements.

The exact layout of the lines will be determined by the particular ASIC design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass are used as the dielectric layer, but other dielectrics such as a nitride or polyimide films (which can be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. After the formation of the vias in the dielectric, the next metallization layer (metal-2) is deposited and patterned as described above. In some cases, it may be necessary to form and pattern one or more additional metallization layers to complete the wiring of the ASIC.

4. Conclusion

Although the preferred embodiments of the present invention has been described in detail, it should be understood that the present invention may be embodied in many other specific forms without departing from the spirit or scope of the invention. For example, the conductivity types of the transistors of the preferred base cells described above may be reversed so that the base cell of FIG. 2 employs six PMOS transistors and four NMOS transistors rather than the four PMOS and six NMOS transistors described above. Therefore, the present examples and embodiments are to be considered as illustrative and not restrictive, and the invention is not to be limited to the details given herein, but may be modified within the scope of the appended claims.

What is claimed is:

1. A gate array structure formed on a semiconductor substrate and having an array of identical base cells in a core region of the structure, each such base cell including a plurality of transistors consisting essentially of:
    a first group of four transistors of a first conductivity type located at a first side of said base cell, and each transistor of said first group of four transistors of said base cell having a first gate width;
    a second group of four transistors of a second conductivity type located at a second side of said base cell, and opposite said first conductivity type, and each transistor of said second group of four transistors of said base cell having a second gate width that is substantially equal to the first gate width; and
    a third group of transistors of said first conductivity type located adjacent to said first side of said base cell and opposite said second side, each having a third gate width which is smaller than the first and second gate widths, wherein the transistors of the first and second groups all have gates that are aligned in parallel with a first axis, and the transistors of the third group all have gates that are aligned in parallel with a second axis that is substantially perpendicular to the first axis.

2. The gate array structure of claim 1 wherein the third group of transistors has two transistors.

3. The gate array structure of claim 1 wherein the first group of transistors contains at least one set of two transistors which are connected in series and share a source/drain region.

4. The gate array structure of claim 1 further having a tap for connecting to a power line or a ground line proximate the first group of transistors.

5. The gate array structure of claim 1 wherein the second group of transistors contains at least one set of two transistors which are connected in series and share a source/drain region.

6. The gate array structure of claim 1 wherein a tap for connecting to a power line or a ground line proximate the second group of transistors.

7. The gate array structure of claim 1 wherein the first and third groups are n-type transistors and the second group are p-type transistors.

8. The gate array structure of claim 7 wherein a tap is provided proximate the first group of transistors for connecting to a Vss metal line, and a tap is provided proximate the second group of transistors for connecting to a Vdd metal line.

9. The gate array structure of claim 1 further comprising conductive lines electrically connecting transistors in said first, second, and third groups of transistors from two identical base cells to form a flip flop circuit.

10. The gate array structure of claim 9 wherein one or more transistors from the third group of transistors is directly connected to a clock input.

11. A gate array structure formed on a semiconductor substrate and having an array of identical base cells in a core region of the structure, each such base cell comprising:
    a first group of transistors of a first conductivity type located at a first side of said base cell, and each transistor of said first group of transistors of said base cell having a first gate width;
    a second group of transistors of a second conductivity type located at a second side of said base cell, and opposite said first conductivity type, and each transistor of said second group of said base cell having a second gate width that is substantially equal to the first gate width;
    a third group of transistors of said first conductivity type located adjacent to said first side of said base cell and opposite said second side, each having a third gate width which is smaller than the first and second gate widths, wherein the transistors of the first and second groups all have gates that are aligned in parallel with a first axis, and the transistors of the third group all have gates that are aligned in parallel with a second axis that is substantially perpendicular to the first axis; and
    conductive lines electrically connecting transistors in said first, second, and third groups of transistors to form a random access memory circuit, the random access memory circuit including a three transistor inverter, the three transistor inverter having at least two PMOS transistors configured to increase a switching rise time of the random access memory circuit.

12. The gate array structure of claim 11 wherein said random access memory circuit is a two-port ten transistor (1r 1w) RAM circuit.

13. The gate array structure of claim 11, wherein one of the transistors of the third group is directly connected to a first input transistor of the random access memory circuit and a second of the transistors of the third group is directly connected to a second input transistor of the random access memory circuit.

14. A gate array structure formed on a semiconductor substrate and having an array of identical base cells in a core region of the structure, each such base cell comprising:

a first group of four transistors of a first conductivity type located at a first side of the base cell, each having a first gate width;

a second group of four transistors of a second conductivity type located at a second side of the base cell, said second group of four transistors being located opposite said first side of the base cell having the first group of four transistors having said first conductivity type, each transistor of said second group having a second gate width; and a third group of two transistors of said first conductivity type located at said first side of the base cell, adjacent said first group of four transistors and opposite said second group of four transistors, each of the two transistors have a third gate width that is oriented perpendicular to the first and second group of four transistors; and conductive lines electrically connecting transistors in said first, second, and third groups of transistors to form a random access memory circuit, the random access memory circuit including a three transistor inverter, the three transistor inverter having at least two PMOS transistors configured to increase a switching rise time of the random access memory circuit.

15. The gate array structure of claim 14 wherein said random access memory circuit is a two-port ten transistor (1r 1w) RAM circuit.

16. The gate array structure of claim 14 wherein the first and second gate widths are substantially the same, while the third gate width is substantially less than said first gate width, and wherein the two transistors of the third group of transistors are connected to two input transistors of said random access memory circuit, thereby drawing less current.

17. A method of fabricating a gate array comprising a step of forming an array of identical base cells in a core region of the structure, each such base cell being prepared according to the following steps of:

forming a first group of four transistors at a first side of the base cell;

forming a second group of four transistors at a second side of the base cell and arranged in parallel to the first group of four transistors; and forming a third group of two low capacitance transistors adjacent to said first group of four transistors and opposite said second group of four transistors of the base cell;

wherein the first group of four transistors is of a first conductivity type, and each has a first gate width;

wherein the second group of four transistors is of a second conductivity type, opposite said first conductivity type, and each transistor of said second group has a second gate width that is substantially equal to the first gate width;

wherein the third group of two low capacitance transistors is of said first conductivity type, and each transistor has a third gate width that is substantially shorter than the first and second gate widths;

wherein the transistors of the first and second groups all have gates that are aligned in parallel with a first axis, and the two transistors of the third group all have gates that are aligned in parallel with a second axis that is substantially perpendicular to the first axis; and wherein the steps of forming and patterning the first metallization layer forms at least some of the connections for a random access memory circuit that implements the third group of two low capacitance transistors as input transistors, the random access memory circuit employing only those transistors found on a single base cell, the random access memory circuit including a three transistor inverter, the three transistor inverter having at least two PMOS transistors configured to increase a switching rise time of the random access memory circuit.

18. The method of claim 17 wherein the step of forming the first, second, and third groups of transistors forms a ten transistor base cell.

19. The method of claim 17 wherein the step of forming the first, second, and third groups of transistors forms a base cell in which the first and second groups of transistors each contain at least one set of two transistors which are connected in series and share a source/drain region.

20. The method of claim 17 wherein the step of forming the first, second, and third groups of transistors forms a base cell forms a first tap proximate the first group of transistors and a second tap proximate the second group of transistors, one of the first and second taps provided for connecting to a power line and the other of the first and second taps provided for connecting to a ground line.

21. The method of claim 17 further comprising the following steps:

forming a first metallization layer over at least a portion of said core region; and patterning said first metallization layer to provide electrical connections between at least some of the transistors in the base cells.

22. The method of claim 21 further comprising the following steps:

forming a second metallization layer over at least a portion of said core region; and patterning said second metallization layer to provide further electrical connections between at least some of the transistors through one or more conductive contacts.

23. The method of claim 21 wherein the steps of forming and patterning the first metallization layer forms at least some of the connections for a flip flop circuit which employs transistors from at least two base cells.

24. The method of claim 21 further comprising fabrication steps for forming an integrated circuit from said away of base cells.

25. A gate array structure formed on a semiconductor substrate and having an array of identical base cells in a core region of the structure, each such base cell comprising:

a first group of four transistors of a first conductivity type, each having a first gate width of about 5.7 microns;

a second group of four transistors of a second conductivity type, opposite said first conductivity type, each transistor of said second group having a second gate width of about 5.9 microns; and a third group of two transistors of said first conductivity type, each having a third gate width of about 3.65 microns, wherein in at least some of the base cells of the gate array structure, transistors from the first, second, and third groups are wired to form a single random access memory circuit within a single base cell;

whereby said single random access memory does not utilize neighboring base cells to provide a densely packed gate array structure.

26. The gate array structure of claim 25 wherein the single base cell is divided into grid units of about 1.4 micron by about 1.4 micron.

27. The gate array structure of claim 25 wherein the transistors of the first and second groups all have gates that are aligned in parallel with a first axis, and the transistors of the third group all have gates that are aligned in parallel with a second axis that is substantially perpendicular to the first axis, the single base cell having about 15 grid units along the first axis, and about 8 grid units along the second axis.

28. The gate array structure of claim 25 wherein the first and second groups of transistors each contain at least one set of two transistors which are connected in series and share a source/drain region.

29. The gate array structure of claim 25 wherein each base cell further comprises a first lap proximate the first group of transistors and a second tap proximate the second group of transistors, one of the first and second laps provided for connecting to a power line that provides 3.3 volts and has a 1.4 micron width, and the other of the first and second taps provided for connecting to a ground line having a 1.4 micron width.

30. The gate array structure of claim 25 wherein in at least some of those base cells wired to form random access memory circuits, wiring is provided exclusively at a first metallization level.

31. The gate array structure of claim 25 wherein in at least some of those base cells wired to from random access memory circuits, wiring is provided at both a first metallization level and in a second metallization level.

32. The gate array structure of claim 25 wherein stud random access memory circuit is a two-port (1r 1w) RAM circuit having a three transistor inverter, the three transistor inverter having at least two p-type transistors configured to increase switching rise times of the two-port (1r 1w) RAM circuit.

33. The gate array structure of claim 32 wherein the two transistors of the third group of transistors are connected to provide two low capacitance input transistors for said random access memory circuit.

* * * * *